United States Patent
Wang

(10) Patent No.: US 7,084,066 B1
(45) Date of Patent: Aug. 1, 2006

(54) METHOD OF UNIFORMLY ETCHING REFRACTORY METALS, REFRACTORY METAL ALLOYS AND REFRACTORY METAL SILICIDES

(75) Inventor: T. Frank Wang, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/609,387

(22) Filed: Jul. 3, 2000

(51) Int. Cl.
*H01L 21/461* (2006.01)
*H01L 21/302* (2006.01)

(52) U.S. Cl. ............... 438/706; 438/714; 438/720

(58) Field of Classification Search ......... 438/689, 438/706, 745, 722
See application file for complete search history.

(56) References Cited

U.S. PATENT DOCUMENTS

| | | | |
|---|---|---|---|
| 4,670,091 A * | 6/1987 | Thomas et al. | 156/645 |
| 4,713,141 A * | 12/1987 | Tsang | 438/695 |
| 4,923,562 A | 5/1990 | Jucha et al. | |
| 4,980,018 A * | 12/1990 | Mu et al. | 438/9 |
| 5,100,505 A | 3/1992 | Cathey, Jr. | |
| 5,143,866 A | 9/1992 | Matsutani | |
| 5,310,456 A * | 5/1994 | Kadomura | 156/657 |
| 5,360,510 A * | 11/1994 | Kadomura | 156/665 |
| 5,407,845 A * | 4/1995 | Nasu et al. | 437/40 |
| 5,545,289 A * | 8/1996 | Chen et al. | 134/1.2 |
| 5,609,775 A | 3/1997 | Liu | |
| 5,626,775 A * | 5/1997 | Roberts et al. | 216/67 |
| 5,705,433 A * | 1/1998 | Olson et al. | 438/695 |
| 5,772,906 A | 6/1998 | Abraham | |
| 5,846,443 A | 12/1998 | Abraham | |
| 5,853,602 A * | 12/1998 | Shoji | 216/46 |
| 5,874,363 A * | 2/1999 | Hoh et al. | 438/721 |
| 5,952,244 A | 9/1999 | Abraham et al. | |
| 5,994,235 A * | 11/1999 | Ouchi | 438/719 |
| 6,277,763 B1 * | 8/2001 | Kugimiya et al. | 438/720 |

OTHER PUBLICATIONS

David A. Shumate, et al., "Development of a TiW Plasma Etch Process Using a Mixture Experiment and Response Surface Optimization", IEEE Transactions on Semiconductor Manufacturing, vol. 9 No. 3, Aug. 1996.

* cited by examiner

*Primary Examiner*—Duy-Vu N. Deo
(74) *Attorney, Agent, or Firm*—Merchant & Gould, P.C.; Steven B. Kelber

(57) ABSTRACT

This invention is directed to a process for etching a semiconductor device using an etchant composition to form a predetermined etched pattern therein. The semiconductor device typically has a plurality of layers. At least one of the layers comprises a refractory metal, refractory metal alloy or refractory metal silicide. The etchant composition contains a high concentration of chlorine. The source (or TCP) power is decreased over that of conventional methods, and the bias (or RF) power is increased. Using such an etchant composition, along with the adjusted power levels, uniform etching and increased oxide selectivity is achieved.

20 Claims, No Drawings

METHOD OF UNIFORMLY ETCHING REFRACTORY METALS, REFRACTORY METAL ALLOYS AND REFRACTORY METAL SILICIDES

BACKGROUND OF THE INVENTION

1. Field of the Invention

The present invention relates to semiconductor devices and fabrication thereof. More particularly, the present invention relates to a method of effectively and uniformly etching refractory metals, refractory metal alloys and refractory metal silicides for use in semiconductor devices.

2. Discussion of the Background

In semiconductor fabrication, devices may be formed on a semiconductor wafer or substrate, which is typically made of silicon. Above the wafer, there may be disposed a plurality of layers from which the devices may be fabricated.

To form the devices, a portion of the layers is patterned using a suitable etching technique and an appropriate etchant. Semiconductor processing makes extensive use of etching for active area definition, gate recesses, waveguide formation and so on.

Refractory metals such as, for example, molybdenum (Mo), titanium (Ti) and tungsten (W), along with their alloys and silicides, may be used in manufacturing various semiconductor devices. As used herein, the term "refractory metal-containing material" refers to a material containing a refractory metal, a refractory metal alloy or a refractory metal silicide. As used herein, the term "refractory metal-containing layer" refers to a layer of a semiconductor device that contains a refractory metal, a refractory metal alloy or a refractory metal silicide.

Conventional technology for etching a layer containing a refractory metal-containing material uses $SF_6$ or other fluorine-containing compound such as $CF_4$ as the etchant, along with $BCl_3$ and possibly $CF_4$, $Cl_2$ and $O_2$. The process is operated at a high source (or TCP) power, typically about 500 to about 600 watts, and a low bias (or RF) power, typically about 70 to about 150 watts.

For example, U.S. Pat. No. 4,923,562 to Jucha et al. discloses an apparatus and a method for anisotropically etching refractory metals using a feed gas mixture that includes a fluorine source, a bromine source and an oxygen source.

Similarly, U.S. Pat. No. 5,853,602 to Shoji discloses a method of dry etching for patterning a refractory metal layer using a gaseous mixture of $SF_6/Cl_2/CO$ as the etching gas. The $SF_6$ and $Cl_2$ supply fluorine and chlorine radicals to etch the refractory metal layer, while the CO produces a reaction product that is deposited on the side surface of the refractory metal layer and prevents the fluorine and chlorine radicals from etching the sides of the refractory metal layer.

U.S. Pat. No. 5,143,866 to Matsutani discloses a dry etching method for refractory metals and their compounds using a mixed gas composition of an etchant gas for etching the refractory metal and a deposit gas for depositing the refractory metal such that the deposited refractory metal protects the side walls of the refractory metal to be etched from side etching. The deposit gas is a halide of the refractory metal that is to be etched.

There are problems, however, with the conventional technology. One problem is that the etch rate across the wafer is not uniform. The differential in etch rate uniformity in the conventional process is typically about 20 to 30 percent. Such a large differential in etch rate uniformity requires a large amount of overetch time in order to completely clear or etch away the refractory metal-containing layer within the etching area.

Another problem with the conventional process is poor oxide selectivity. Selectivity refers generally to the ability of an etchant source gas to discriminate between the different layers of the semiconductor device that may be exposed during an etch. Here, the oxide selectivity is expressed as the ratio of the etch rate of the refractory metal-containing material to the etch rate of the oxide. For a given etch, an etchant source gas having a low oxide selectivity tends to etch away at the oxide layer at a higher rate than an etchant source gas having a high oxide selectivity. The poor oxide selectivity, which here is about 1:1 or less, causes an oxide gouge as a result of the overetch step in areas where the refractory metal-containing layer has already been completely etched away.

Yet another problem is that the existing technology cannot meet the requirement of a residual oxide layer of no less than about 200 Angstroms in a M-I-M capacitor. A residual oxide layer of at least no less than about 200 Angstroms ensures reliability of the etched capacitor. The combination of the non-uniform etch rate and the poor oxide selectivity means that the existing technology is not capable of satisfactorily completing the etch (i.e., removing all the refractory metal-containing material and leaving a minimum of no less than about 200 Angstroms of residual oxide in the etched areas).

Yet another problem with the conventional process is that detection of the end point of the etch is not reliable.

In view of the aforementioned deficiencies attendant with the prior art methods, it is clear that there exists a need for a method of etching refractory metals, refractory metal alloys and refractory metal silicides having a uniform etch rate and an increased selectivity to oxide.

SUMMARY OF THE INVENTION

Accordingly, one object of this invention is to provide a method of uniformly etching refractory metals, refractory metal alloys and refractory metal silicides.

Another object of the invention is to provide a method of etching refractory metals, refractory metal alloys and refractory metal silicides that also has an increased selectivity to oxide.

To achieve the foregoing and other objects, and in accordance with the purpose of the present invention as embodied and broadly described herein, the present invention relates, in one embodiment, to a method for uniformly etching a semiconductor device comprising a plurality of layers, wherein at least one of the layers comprises a refractory metal-containing material. The method includes the step of at least partially etching the layers to an end point using a first etchant chemistry. There is also included the step of further etching the layers using a second etchant chemistry.

In another embodiment, the present invention relates to a method for etching through a selected portion of a refractory metal-containing layer and an oxide layer. The refractory metal-containing layer is disposed above the oxide layer. The method includes the step of etching at least partially through the refractory metal-containing layer using a first etchant chemistry to an end point. The method further includes a the step of partially etching through the oxide layer using a second etchant chemistry.

DESCRIPTION OF THE PREFERRED EMBODIMENTS

It has now been found that a change or shift in the power distribution, i.e., the source power and the bias power, can improve etch rate uniformity. It has also been found that changing the etchant composition from a fluorine-based composition to a chlorine-based composition improves oxide selectivity.

As used herein, uniformity of the etch rate may be determined using the following formula:

$$\frac{\text{maximum etch rate} - \text{minimum etch rate}}{(2)(\text{average etch rate})}.$$

The process described in the present invention is for etching a semiconductor device to form a predetermined etched pattern therein. The process comprises providing a semiconductor device having a plurality of layers. At least one of the layers of the semiconductor device comprises a refractory metal-containing material. The thickness of the refractory metal-containing layer is about 1500 Angstroms. The refractory metal-containing material may be a refractory metal such as, for example, titanium, molybdenum or tungsten, a refractory metal alloy such as, for example, TiW or a refractory metal silicide such as, for example, tungsten silicide and molybdenum silicide.

In a preferred embodiment, the process of the present invention is used to pattern a layer of a refractory metal-containing material that has been deposited over a layer of oxide such as, for example, $SiO_2$. The thickness of the oxide layer is about 500 Angstroms. The oxide layer may be deposited on a typical silicon semiconductor wafer or substrate or may be deposited on a layer of a refractory metal-containing material such as, for example, TiW, aluminum, TiN or a tungsten alloy. If desired, additional layers may also be present. The desired pattern is preferably etched into the refractory metal-containing layer, stopping on the oxide layer and leaving a residual oxide thickness of no less than about 200 Angstroms.

The etching of the semiconductor device comprising a plurality of layers is performed in two steps using two different etchant chemistries. The method includes the step of at least partially etching the layers within the etching area to an end point using a first etchant chemistry. Thereafter, the layers within the etching area are etched again, albeit with a second etchant chemistry. This second etching step is preferably allowed to proceed through any portion of the layers within the etching area not etched during the first etching step (i.e., in order to clear any remaining portion of the layer) and partially through the oxide layer, typically for a time period of about 40 percent of the first etching step.

A shift in the power distribution during the initial etching step improves etch rate uniformity. More specifically, the source power should be lower than that used in the conventional process, and the bias power should be higher than that of the conventional process. Typical ranges for the source power and the bias power, respectively, in the conventional process are about 500 to about 600 watts and about 70 to about 150 watts. In the process of the present invention, the source power is reduced and the bias power is increased and should be such that the ratio of bias power to source power is about 0.5–5. In the process of the present invention, the source power is between about 100 and about 450 watts. Preferably, the source power is between about 125 and about 210 watts and, most preferably, is between about 140 and about 170 watts. The bias power is between about 200 and about 500 watts. Preferably, the bias power is between about 225 and about 350 watts and, most preferably, is between about 240 and about 270 watts.

Etching with the first etchant chemistry continues until the end point is reached. The end point is the point at which the bulk of the refractory metal, refractory metal alloy or refractory metal silicide has been etched away. The endpoint is detected using optical emission, more specifically, by measuring the percent change in the optical emission intensity, as known to those skilled in the art. Typically, detection at 703 nm is used. After the end point has been detected, the second etchant chemistry is employed to etch away the residual portion of the layers within the etching area, if any, and through part of the oxide layer before being terminated.

The layers located within the etching area are etched with an etchant composition to form a predetermined pattern therein. The etchant composition used in the present invention is chlorine-based. Unlike the prior art etchant compositions that are fluorine-based, the etchant composition used in the present invention contains a higher chlorine content than conventional etchant compositions. In other words, the etchant composition contains a high chlorine concentration instead of a high fluorine concentration. The amount of chlorine in the etchant composition is about 50 percent to about 95 percent, more preferably about 56 percent to about 90 percent, of the total gas flow of the etchant composition.

The etchant composition comprises a first etchant chemistry and a second etchant chemistry. The first etchant chemistry comprises a source of chlorine, typically chlorine gas. Other sources of chlorine such as, for example, HCl and $CCl_4$ may also be used; however, $BCl_3$ may not be used as a source of chlorine. Compared with conventional etchant compositions, the flow volume of $BCl_3$ in sccm ("standard cubic centimeters per minute") is reduced, preferably, to zero. $BCl_3$ may be used, though not as a source of chlorine, if one of the layers is aluminum. In any event, the flow volume of $BCl_3$ is much less than that used in the conventional process.

To increase the etch rate, the first etchant chemistry further comprises a small amount of a fluorine-containing material such as, for example, $SF_6$, $F_2$, $NF_3$ or $CF_4$. If desired, the fluorine-containing material may be left out of the first etchant chemistry entirely.

Additionally, the first etchant chemistry may also comprise $N_2$.

By way of example, a mixture of $Cl_2/SF_6/N_2$ having a flow volume ratio in sccm of 45:30:5 has been found suitable for use as the first etchant chemistry. Such a mixture uniformly etches through refractory metals, refractory metal alloys and refractory metal silicides.

Like the first etchant chemistry, the second etchant chemistry comprises a source of chlorine, typically chlorine gas. Other sources of chlorine such as, for example, HCl and $CCl_4$ may also be used. Again, $BCl_3$ may not be used as a source of chlorine, and the flow volume of $BCl_3$ in sccm is preferably zero. Additionally, the second etchant chemistry may include $N_2$. No fluorine is used in the second etchant chemistry because, while not wishing to be bound to any theory, it is believed that fluorine results in a low oxide selectivity.

By way of example, a mixture of $Cl_2/N_2$ having a flow volume ratio in sccm of 45:5 to 45:15 has been found suitable for use as the second etchant chemistry. Such a mixture has an improved oxide selectivity and allows for stopping of the etch when a residual oxide layer having a thickness of no less than about 200 Angstroms is reached.

In accordance with a preferred embodiment of the present invention, the refractory metal-containing layer is first etched with a first etchant chemistry. Etching of the refractory metal-containing layer terminates when it is determined that the bulk of refractory metal-containing layer has been etched through. The first etchant chemistry comprises a chlorine source and a fluorine source. The first etchant chemistry may also comprise $N_2$. Preferably, the chlorine concentration is greater than about 56 percent of the total gas flow.

Subsequently, the oxide layer, as well as any residual refractory metal-containing material, is etched with a second etchant chemistry. Etching of the oxide layer terminates when the layer of residual oxide is no less than about 200 Angstroms thick. The second etchant chemistry comprises a chlorine source. The second etchant chemistry may also comprise $N_2$. Preferably, the chlorine concentration is about 75 percent of the total gas flow.

The inventive etch process of the present invention may be performed in any of the known plasma processing apparatuses, including those adapted for dry etching, plasma etching, reactive ion etching, magnetically enhanced reactive ion etching or the like. To further elaborate, in a typical plasma processing chamber adapted for dry etching, the semiconductor wafer or substrate is treated with plasma. The chamber includes an inlet port through which etchant source gases are supplied to the chamber interior. A suitable RF energy source is applied to electrodes associated with the chamber to induce plasma. The energy itself may be coupled inductively or capacitively to sustain the plasma, as is known. Species are then formed from the etchant gas source to react with the wafer and etch away at the plasma-contacting layer of the wafer. The by-products, which may be volatile, are then exhausted through an exit port.

Plasma etching relates to the situation where the wafer is positioned on the anode, or ground electrode, during wafer processing. On the other hand, reactive ion etching relates to the situation where the wafer is positioned on the cathode, or powered electrode, during processing. Magnetically enhanced reactive ion etching represents a variant of the reactive ion etching geometry wherein a magnetic field is applied to reduce the loss of energetic electrons to the reactor wall surfaces.

It is contemplated that the invention may be practiced in any of the above reactors, as well as other suitable plasma processing reactors. Note that the above is true irrespective of whether energy to the plasma is delivered through capacitively coupled parallel electrode plates, through electron resonance microwave plasma sources or through inductively coupled RF sources such as helicon, helical resonators and transformer coupled plasma.

In a preferred embodiment, the present invention is employed in a TCP™ 9600 SE plasma reactor, which is available from Lam Research Corporation. A mechanical clamp is used to hold the layers to be etched. As mentioned above, however, any other conventional and suitable plasma processing systems may be employed. Particularly, a capacitor coupling reactor may also be used to practice the present invention. When such a reactor is used, the bias power should be between about 100 and about 750 watts, preferably between about 250 and about 350 watts. Such a reactor does not use source power.

The process of the present invention results in a very uniform etch rate across the wafer or substrate. Uniformity for the etch is advantageously good, at a low value of no more than about ±3.5 percent.

The process of the present invention also results in an improved oxide selectivity of about 3:1. The higher oxide selectivity is especially advantageous in preventing excess oxide loss when the etch of the refractory metal-containing material is extended to ensure that all of the refractory metal-containing material is removed.

Other advantages of the process of the present invention include accurate determination of the end point during the main etch, a large operating pressure range (about 5–20 mTorr) and a tunable etch rate from 3500 Angstroms per minute to 1500 Angstroms per minute, as opposed to 2000±500 Angstroms per minute for the conventional process. The large operating pressure range is important because, in the conventional etching technology, even a small change in pressure results in a change in uniformity. The large operating pressure range means that uniformity is not as sensitive to pressure changes as it is in the conventional technology.

The invention will now be described by reference to the following detailed example. The example is set forth by way of illustration and is not intended to be limiting in scope.

EXAMPLE

A M-I-M capacitor device comprising a plurality of layers is made by first depositing a layer of $SiO_2$ having a thickness of about 500 Angstroms on a semiconductor substrate. A layer of TiW having a thickness of about 1500 Angstroms is then deposited on the layer of $SiO_2$. The substrate is placed in a TCP™ 9600 SE plasma reactor and is held together with a mechanical clamp. A first etchant chemistry comprising about 45 sccm of $Cl_2$, about 30 sccm of $SF_6$ and about 5 sccm of $N_2$ is fed into the etching chamber. The pressure in the chamber is kept at about 11 mTorr. The source power is about 160 watts, and the bias power is about 260 watts. The TiW layer is etched until the end point is detected. At this point, a second etchant chemistry comprising about 45 sccm of $Cl_2$ and about 5 sccm of $N_2$ is fed into the etching chamber. The pressure in the chamber is again kept at about 11 mTorr. The source power is about 400 watts, and the bias power is about 80 watts. The oxide layer is etched for about 10 seconds. Under such conditions, a uniform etch rate is seen and, in the second etch step, the oxide selectivity is about 3:1.

Having now fully described the invention, it will be apparent to one of ordinary skill in the art that changes and modifications can be made thereto without departing from the spirit or scope of the invention as set forth herein.

What is claimed is:

1. A method of etching a semiconductor device to form an etched pattern therein, comprising:
   (a) providing a semiconductor device having a plurality of layers, at least one of the layers of the semiconductor device comprising an unetched refractory metal-containing material;
   (b) etching the unetched refractory metal-containing material layer of the semiconductor device with a first etchant chemistry which comprises a chlorine source free of $BCl_3$ and a fluorine source; followed with
   (c) etching the semiconductor device with a second etchant chemistry which is free of fluorine,
   wherein etching comprises etching the semiconductor device with a source power of from about 100 watts to about 450 watts and a bias power of from about 200 watts to about 500 watts.

2. The method of claim 1, wherein the ratio of the bias power to the source power is about 0.5:5.

3. A method of etching an unetched refractory metal-containing layer and an oxide layer, the method comprising:
   (a) etching the unetched refractory metal-containing layer to an end point using a first etchant chemistry at a source power of from about 100 watts to about 450 watts and a bias power of from about 200 watts to about 500 watts, wherein the first etchant chemistry comprises a chlorine source free of $BCl_3$ and a fluorine source; and
   (b) etching partially through the oxide layer using a second etchant chemistry, wherein the second etchant chemistry comprises a chlorine source, and contains no fluorine.

4. The method of claim 3, wherein the unetched refractory metal-containing layer is disposed above the oxide layer.

5. The method of claim 3, wherein the unetched refractory metal-containing layer comprises a material selected from the group consisting of refractory metals, refractory metal alloys and refractory metal silicides.

6. The method of claim 5, wherein the unetched refractory metal-containing material comprises a refractory metal selected from the group consisting of molybdenum, titanium and tungsten or a refractory metal silicide selected from the group consisting of tungsten silicide and molybdenum silicide.

7. The method of claim 5, wherein the unetched refractory metal-containing material comprises TiW alloy.

8. The method of claim 3, wherein the chlorine source of the first etchant chemistry is selected from the group consisting of $Cl_2$, HCl and $CCl_4$.

9. The method of claim 3, wherein the fluorine source of the first etchant chemistry is selected from the group consisting of $SF_6$, $F_2$, $NF_3$ and $CF_4$.

10. The method of claim 3, wherein the first etchant chemistry has a chlorine concentration of about 50 percent to about 95 percent.

11. The method of claim 3, wherein the first etchant chemistry further comprises $N_2$.

12. The method of claim 3, wherein the chlorine source of the second etchant chemistry is selected from the group consisting of $Cl_2$, HCl and $CCl_4$.

13. The method of claim 3, wherein the second etchant chemistry has a chlorine concentration of about 50 percent to about 95 percent.

14. The method of claim 3, wherein the second etchant chemistry further comprises $N_2$.

15. The method of claim 3, wherein the first etchant chemistry comprises about 45 sccm of $Cl_2$, about 30 sccm of $SF_6$ and about 5 sccm of $N_2$.

16. The method of claim 15, wherein the bias power is from about 250 watts to about 350 watts.

17. The method of claim 3, wherein the second etchant chemistry comprises about 45 sccm of $Cl_2$ and about 15 sccm of $N_2$.

18. The method of claim 3, wherein the source power is from about 125 watts to about 210 watts and the bias power is from 225 watts to about 310 watts.

19. The method of claim 3, wherein the ratio of the bias power to the source power is about 0.5:5.

20. A method of etching a semiconductor device using a capacitive coupling plasma reactor to form a pattern on the semiconductor device, comprising:
   (a) providing a semiconductor device having a plurality of layers, at least one of the layers of the semiconductor device comprising an unetched refractory metal-containing material; and
   (b) etching the unetched refractory metal-containing material of the semiconductor device at a bias power of from about 100 watts to about 750 watts, with a first etchant chemistry comprising chlorine free of $BCl_3$ and a fluorine source; followed with
   (c) etching the semiconductor device with a second etchant chemistry free of fluorine.

* * * * *